US012757498B2

(12) United States Patent
Hsu et al.

(10) Patent No.: US 12,757,498 B2
(45) Date of Patent: Oct. 6, 2026

(54) CIRCUIT FOR PREVENTING CURRENT BACKFLOW, CHIP, AND ELECTRONIC SYSTEM

(71) Applicant: REALTEK SEMICONDUCTOR CORP., Hsinchu (TW)

(72) Inventors: Heng-Chia Hsu, Hsinchu (TW); Jun Yang, Suzhou (CN); Yu-Sian Yang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 608 days.

(21) Appl. No.: 18/132,681

(22) Filed: Apr. 10, 2023

(65) Prior Publication Data

US 2024/0178218 A1 May 30, 2024

(30) Foreign Application Priority Data

Nov. 30, 2022 (CN) ......................... 202211524675.7

(51) Int. Cl.

*H10D 89/60* (2025.01)
*H03K 17/081* (2006.01)
*H03K 19/003* (2006.01)
*H10D 84/83* (2025.01)

(52) U.S. Cl.

CPC ..... *H10D 89/813* (2025.01); *H03K 17/08104* (2013.01); *H03K 19/00315* (2013.01); *H10D 84/83* (2025.01); *H10D 89/611* (2025.01); *H10D 89/921* (2025.01)

(58) Field of Classification Search

CPC .. H10D 89/813; H10D 89/921; H10D 89/611; H10D 84/83; H03K 17/08104; H03K 19/00315

See application file for complete search history.

(56) References Cited

U.S. PATENT DOCUMENTS

| | | | | |
|---|---|---|---|---|
| 9,379,098 | B2 * | 6/2016 | Smith | H10D 89/611 |
| 2013/0188287 | A1 | 7/2013 | Imura | |
| 2016/0149403 | A1 | 5/2016 | Ikeda | |

FOREIGN PATENT DOCUMENTS

| | | |
|---|---|---|
| CN | 108199362 A | 6/2018 |
| TW | 201611519 A | 3/2016 |

* cited by examiner

*Primary Examiner* — Ryan Johnson
*Assistant Examiner* — Colleen J O Toole
(74) *Attorney, Agent, or Firm* — Birch, Stewart, Kolasch & Birch, LLP

(57) ABSTRACT

A circuit for preventing current backflow includes: a signal connection terminal, a power input terminal, an internal power supply terminal, an electrostatic protection circuit, a first switch element and a cut-off control circuit. The electrostatic protection circuit is coupled to the signal connection terminal and the internal power supply terminal. The first switch element is coupled between the power input terminal and the internal power supply terminal. The cut-off control circuit is coupled to the signal connection terminal, the power input terminal and the first switch element. The cut-off control circuit controls the switching of the first switch element according to a voltage of the signal connection terminal and a voltage of the power input terminal.

17 Claims, 7 Drawing Sheets

CIRCUIT FOR PREVENTING CURRENT BACKFLOW, CHIP, AND ELECTRONIC SYSTEM

CROSS-REFERENCE TO RELATED APPLICATION

This non-provisional application claims priority under 35 U.S.C. § 119(a) to Patent Application No. 202211524675.7 filed in China on Nov. 30, 2022, the entire contents of which are hereby incorporated by reference.

BACKGROUND

Technical Field

The disclosure relates to a technology for preventing current backflow, in particular to a circuit for preventing current backflow, a chip and an electronic system.

Related Art

Two chips that communicate with each other are electrically connected to each other through the wiring or cable on the circuit board, so there are different channels respectively for signal and power transmission between the two chips when they are in use. However, if one of the chips is powered off, the current may still flow into the other chip through a signal pad (also called current backflow). For example, the signal pad is electrically connected to a P-type field-effect transistor inside the chip, and the base terminal of the P-type field-effect transistor is connected to the power pad of the chip. Therefore, when one of the chips is powered off, the current may still be delivered into the P-type field-effect transistor through the signal pad, and then flow to the power pad through the base terminal, resulting in current backflow. This may not only cause a waste of power, but also make the chip receive current under abnormal conditions, thus affecting its service life. As a result, it is very important to prevent current backflow.

SUMMARY

In view of the defects in the prior art, the disclosure provides a circuit for preventing current backflow, a chip and an electronic system, so as to solve the problem of current backflow when power input stops but a leakage current or a signal is still inputted.

In an embodiment, provided is a circuit for preventing current backflow, including: a signal connection terminal, a power input terminal, an internal power supply terminal, an electrostatic protection circuit, a first switch element and a cut-off control circuit. The electrostatic protection circuit is coupled to the signal connection terminal and the internal power supply terminal. The first switch element is coupled between the power input terminal and the internal power supply terminal. The cut-off control circuit is coupled to the signal connection terminal.

In an embodiment, provided is a chip, including: a signal pad, a power pad, a ground pad, an internal power supply terminal, an electrostatic protection circuit, a first switch element, a cut-off control circuit and a chip main circuit. The electrostatic protection circuit is coupled to the internal power supply terminal, the signal pad and the ground pad. The first switch element is coupled between the power pad and the internal power supply terminal. The cut-off control circuit is coupled to the signal pad, the power pad and the first switch element and configured to control switching of the first switch element according to a voltage of the signal pad and a voltage of the power pad. The chip main circuit is coupled to the signal pad, the power pad and the ground pad.

In an embodiment, provided is an electronic system, including: a first chip and a second chip. The second chip is coupled to the first chip. The second chip includes: a signal pad, a power pad, a ground pad, an internal power supply terminal, an electrostatic protection circuit, a first switch element, a cut-off control circuit and a chip main circuit. The signal pad is coupled to the first chip and configured to receive an input signal from the first chip. The electrostatic protection circuit is coupled to the internal power supply terminal, the signal pad and the ground pad. The first switch element is coupled between the power pad and the internal power supply terminal and configured to turn on or off electrical connection between the power pad and the internal power supply terminal. The cut-off control circuit is coupled to the signal pad, the power pad and the first switch element and configured to control switching of the first switch element according to a voltage of the signal pad and a voltage of the power pad. The chip main circuit is coupled to the signal pad, the power pad and the ground pad.

Based on the above, according to the circuit for preventing current backflow, the chip and the electronic system of any embodiment, when power stops being inputted into the power input terminal, but a leakage current or a signal still is inputted into the signal connection terminal, the cut-off control circuit controls the first switch element to be turned off so as to break electrical connection between the power pad and the internal power supply terminal, thereby preventing the current from flowing into the power pad through the signal connection terminal and the internal power supply terminal, and further avoiding the current backflow.

DETAILED DESCRIPTION

Figure 1:
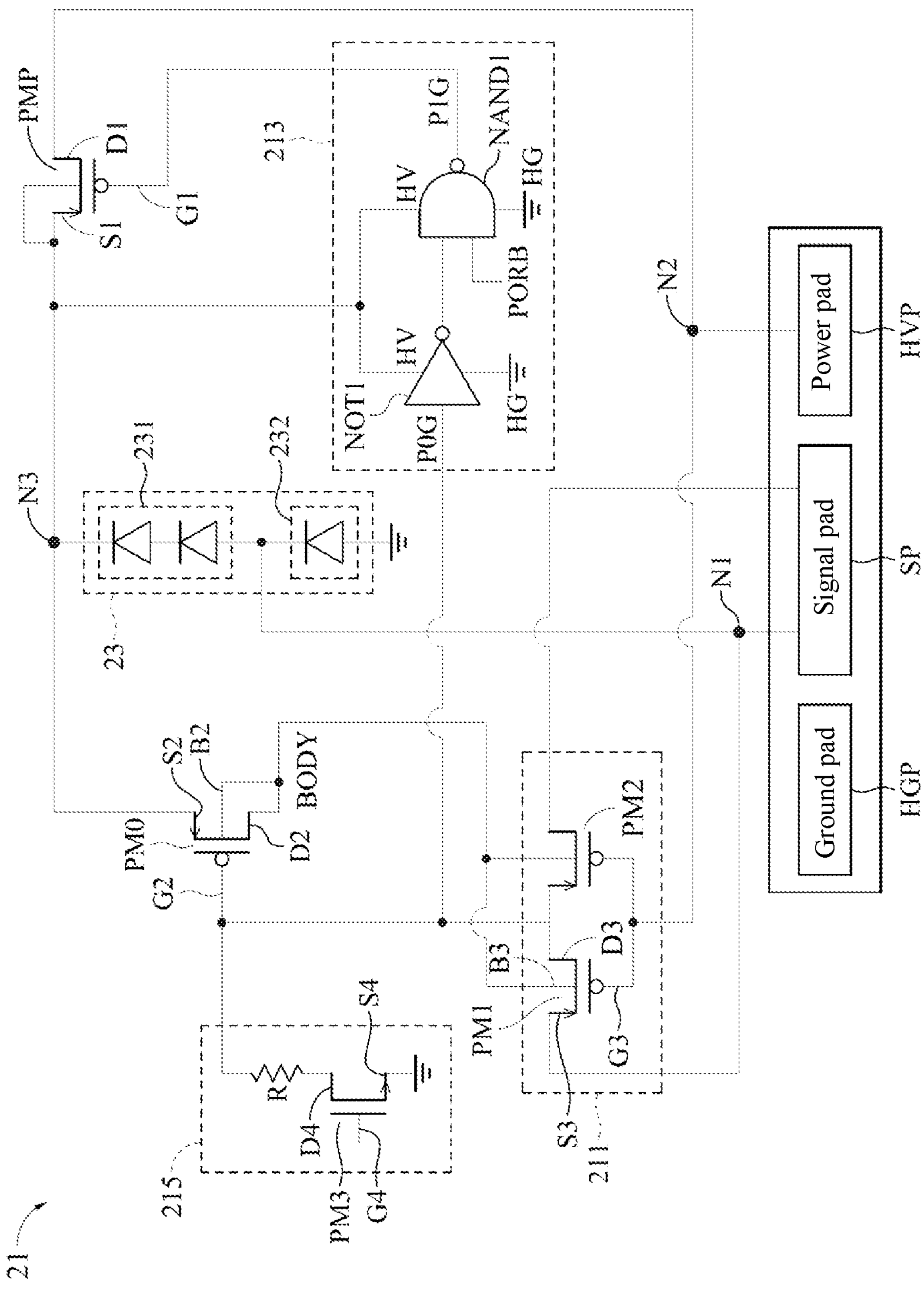
FIG. 1 shows a circuit diagram of a circuit for preventing current backflow according to an embodiment.
Figure 2:
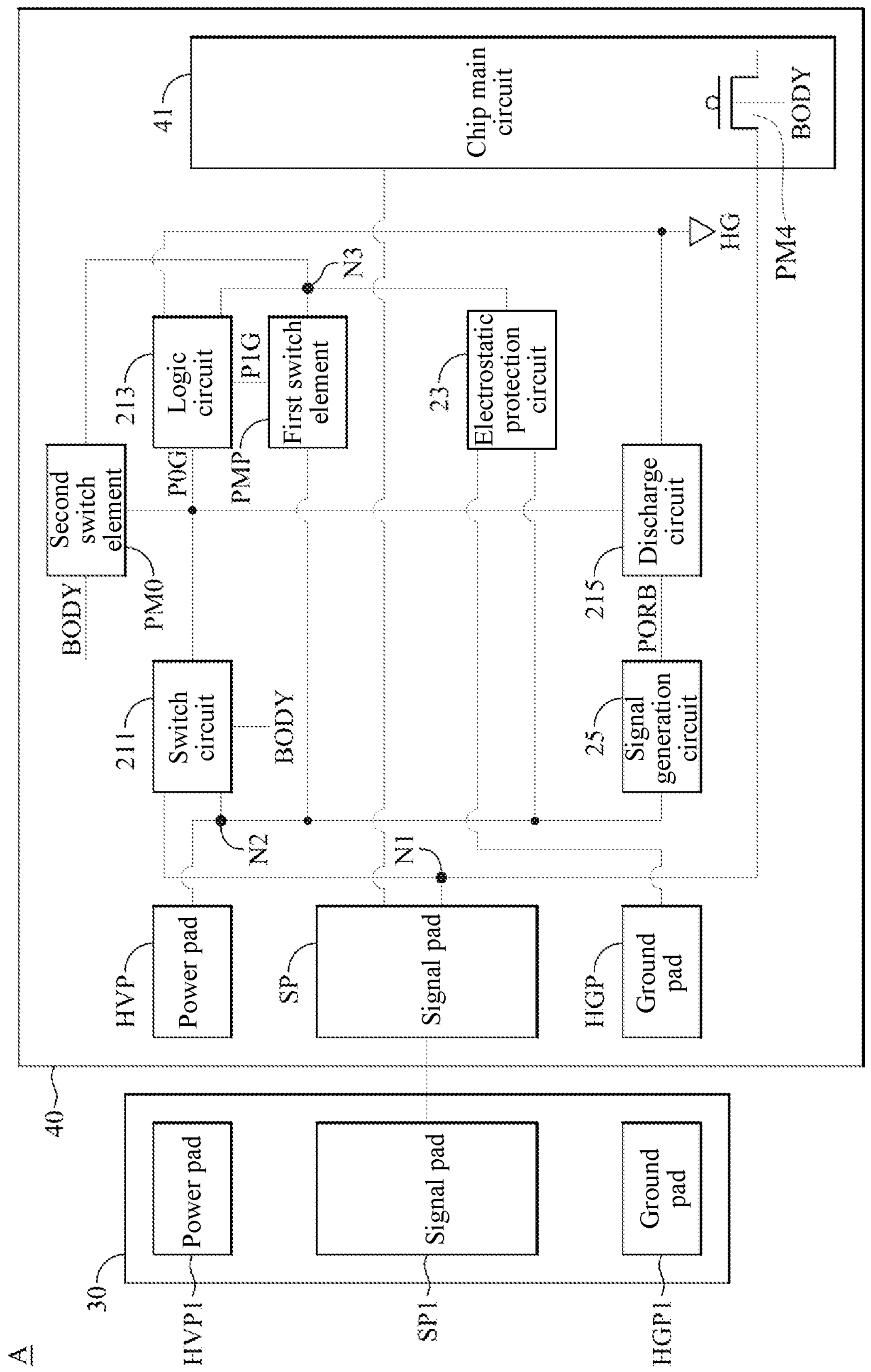
FIG. 2 shows a functional block diagram of an electronic system according to an embodiment.

Referring to FIG. 1 and FIG. 2, a circuit for preventing current backflow includes a signal connection terminal N1, a power input terminal N2, an internal power supply terminal N3, a first switch element PMP, a cut-off control circuit 21, an electrostatic protection circuit 23 and a signal generation circuit 25.

The electrostatic protection circuit 23 is coupled to the signal connection terminal N1 and the internal power supply terminal N3. The first switch element PMP is coupled between the power input terminal N2 and the internal power supply terminal N3. The cut-off control circuit 21 is coupled to the signal connection terminal N1, the power input terminal N2 and the internal power supply terminal N3. The first switch element PMP has a first terminal D1, a second terminal S1 and a first control terminal G1. The first terminal D1 is coupled to the power input terminal N2. The second terminal S1 is coupled to the internal power supply terminal N3. The first control terminal G1 is coupled to the cut-off control circuit 21.

The signal connection terminal N1 is configured to receive an input signal. When the circuit for preventing current backflow is used in a chip, the signal connection terminal N1 is coupled to a signal pad SP of the chip. As shown in FIG. 2, when the circuit for preventing current backflow is used in an electronic system A, the electronic system A includes a first chip 30 and a second chip 40. The signal connection terminal N1 is coupled to a signal pad SP of the second chip 40. The signal pad SP of the second chip 40 is coupled to a signal pad SP1 of the first chip 30. The signal connection terminal N1 receives an input signal from the first chip 30. The first chip 30 has the signal pad SP1, a power pad HVP1 and a ground pad HGP1.

The power input terminal N2 is configured to receive an input power. When the circuit for preventing current backflow is used in a chip, the power input terminal N2 is coupled to a power pad HVP of the chip. As shown in FIG. 2, when the circuit for preventing current backflow is used in the electronic system A, the power input terminal N2 is coupled to a power pad HVP of the second chip 40. In an embodiment, the second chip 40 includes a chip main circuit 41. The chip main circuit 41 is respectively coupled to the signal pad SP, the signal connection terminal N1 and the power pad HVP. The chip main circuit 41 includes a fifth switch element PM4.

The internal power supply terminal N3 is configured to provide a supply power HV.

The electrostatic protection circuit 23 is coupled to the signal connection terminal N1 and the internal power supply terminal N3. When the circuit for preventing current backflow is used in a chip, the electrostatic protection circuit 23 is coupled to the signal pad SP and a ground pad HGP of the chip, and the internal power supply terminal N3. As shown in FIG. 2, when the circuit for preventing current backflow is used in the electronic system A, the electrostatic protection circuit 23 is coupled to the signal pad SP and the ground pad HGP of the second chip 40, and the internal power supply terminal N3.

As shown in FIG. 1, in some embodiments, the electrostatic protection circuit 23 a plurality of diodes 231. The plurality of diodes 231 are connected in series between the internal power supply terminal N3 and the signal connection terminal N1. The plurality of diodes 231 are configured to prevent static electricity from the signal connection terminal N1 from flowing into the internal power supply terminal N3. As shown in FIG. 1, the electrostatic protection circuit 23 further includes a diode 232. The diode 232 is coupled between the signal connection terminal N1 and the ground pad HGP.

The cut-off control circuit 21 controls switching of the first switch element PMP according to a voltage of the signal connection terminal N1 and a voltage of the power input terminal N2. As shown in FIG. 1, the cut-off control circuit 21 is coupled to the first control terminal G1.

When the circuit is in a power-off state, but a leakage current is still inputted into the signal connection terminal N1, the cut-off control circuit 21 controls the first control terminal G1. The first switch element PMP is in an off state so as to prevent the leakage current from flowing into the first terminal D1. Therefore, when the circuit for preventing current backflow is used in the chip, the leakage current can be prevented from flowing into the power pad HVP. When the circuit for preventing current backflow is used in the electronic system A and the second chip 40 is in an off state, the disclosure can prevent the first chip 30 from continuously generating the leakage current that is inputted into the second chip 40.

In some embodiments, when the power input terminal N2 is powered off, the signal connection terminal N1 still receives an input signal and a voltage of the internal power supply terminal N3 is greater than the voltage of the power input terminal N2, the cut-off control circuit 21 generates a power control signal P1G. A voltage of the power control signal P1G comes from the voltage of the internal power supply terminal N3. The power control signal P1G is used to turn off the first switch element PMP.

Referring to FIG. 1, in some embodiments, the circuit for preventing current backflow further includes a second switch element PM0. The second switch element PM0 is coupled to the internal power supply terminal N3. As shown in FIG. 1, the second switch element PM0 includes a third terminal D2, a fourth terminal S2, a second control terminal G2 and a second base terminal B2. The fourth terminal S2 is coupled to the internal power supply terminal N3. The cut-off control circuit 21 is coupled to the second switch element PM0. In addition, as shown in FIG. 1, the cut-off control circuit 21 is coupled to the second control terminal G2.

The second switch element PM0 generates a base voltage BODY according to the voltage of the internal power supply terminal N3. The base voltage BODY is supplied to base terminals of transistors. The cut-off control circuit 21 controls an on/off state of the second switch element PM0 according to the voltage of the signal connection terminal N1 and the voltage of the power input terminal N2.

When the power input terminal N2 is powered off, but the signal connection terminal N1 still receives an input signal, the first switch element PMP needs to be turned off so as to prevent the forward bias backflow generated between the sixth terminal S3 of the third switch element PM1 and the third base terminal B3, resulting in the current flowing into the power input terminal N2. At this time, the voltage of the internal power supply terminal N3 increases. The third switch element PM1 is turned on. At this time, the voltage of the second control terminal G2 increases, so that the second switch element PM0 is turned off, so that the voltage of the base voltage BODY is disconnected from the internal power supply terminal N3.

Figure 6:
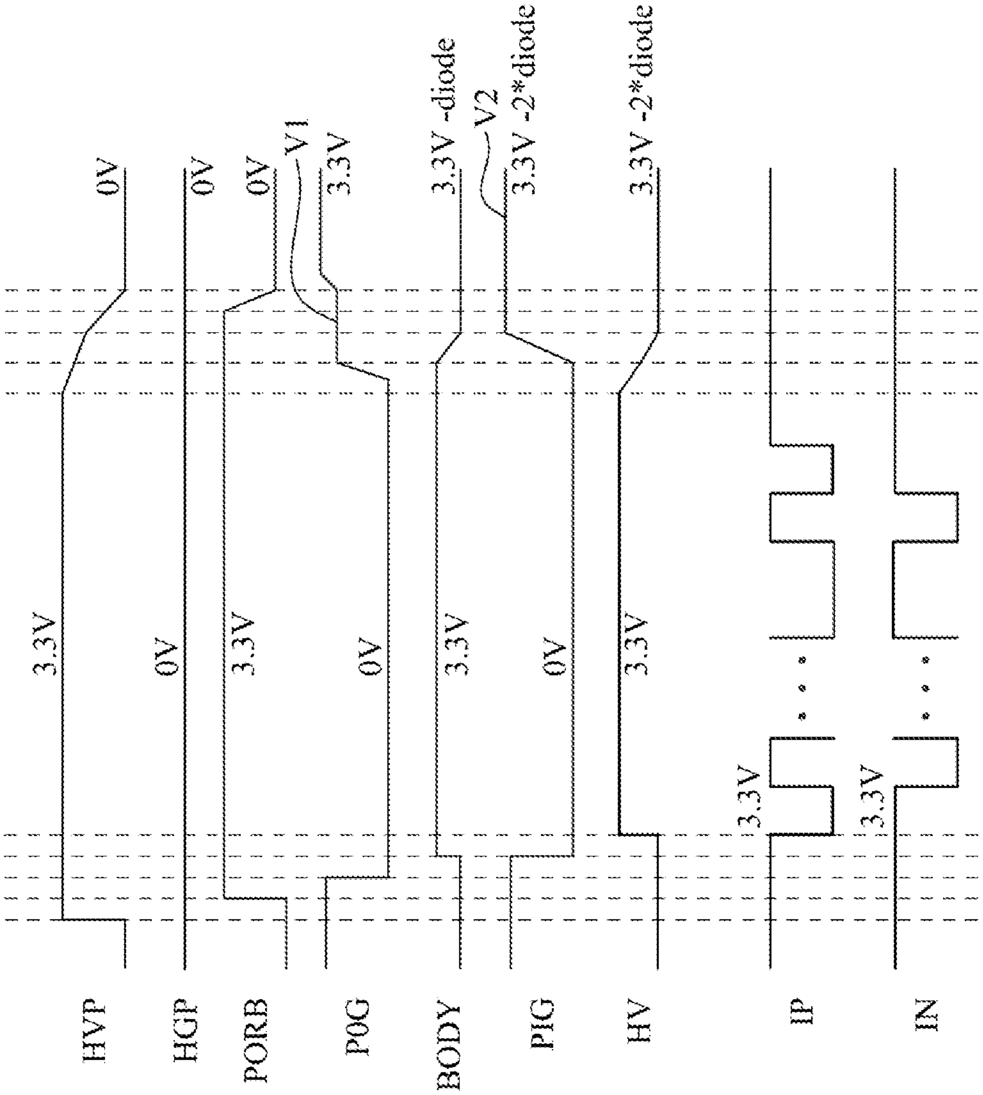
FIG. 6 shows a timing diagram of correlated signals of the circuit for preventing current backflow in FIG. 1 in an off state.
Figure 7:
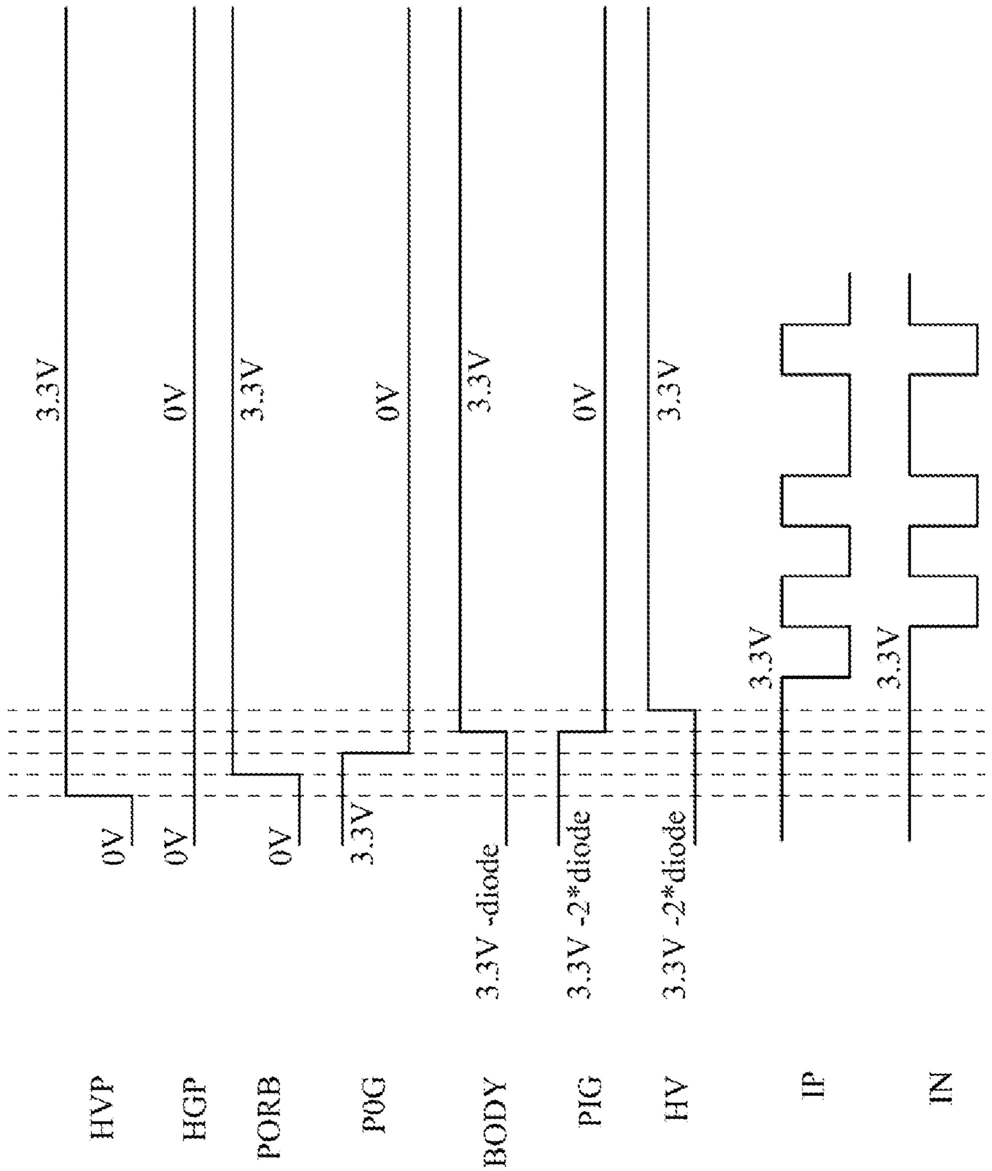
FIG. 7 shows a timing diagram of correlated signals of the circuit for preventing current backflow in FIG. 1 in an on state.

In some embodiments, when the power input terminal N2 is powered off and the signal connection terminal N1 still receives an input signal, the cut-off control circuit 21 controls a voltage of a base control signal P0G to increase from a ground voltage to a first voltage value V1 according to the voltage of the input signal. The cut-off control circuit 21 turns off the second switch element PM0. At this time, if the second switch element PM0 is not turned off, the first switch element PMP will be in an on state, so that the internal power supply terminal N3 will continue to input a current to the power input terminal N2. At this time, forward bias backflow, which comes from the voltage of the signal connection terminal N1, will be generated between the sixth terminal S3 of the third switch element PM1 and the third base terminal B3. As shown in FIG. 1, the base control signal P0G is inputted into the first control terminal G1. The value of the first voltage is not limited, and can be adjusted according to actual needs. FIG. 6 and FIG. 7 shows an example in which the ground voltage is 0 V and the first voltage value V1 is between 0 V and 3.3 V, but the actual implementation is not limited thereto.

Referring to FIG. 1 and FIG. 2, in some embodiments, the cut-off control circuit 21 includes a switch circuit 211, a logic circuit 213 and a discharge circuit 215. The switch circuit 211 is coupled to the signal connection terminal N1, the power input terminal N2 and the second switch element PM0. The switch circuit 211 is coupled to the second control terminal G2. The logic circuit 213 is coupled between the switch circuit 211 and the first switch element PMP. The internal power supply terminal N3 outputs a supply power HV to the logic circuit 213. Besides, the power input terminal N2 is coupled to the power pad HVP. The power input terminal N2 receives an external power.

The switch circuit 211 generates the base control signal P0G according to the voltage of the signal connection terminal N1 and the voltage of the power input terminal N2. The switch circuit 211 controls the on/off state of the second switch element PM0 by using the base control signal P0G. The switch circuit 211 generates the power control signal P1G according to the base control signal P0G and a power-on reset signal PORB. The switch circuit 211 controls an on/off state of the first switch element PMP by using the power control signal P1G. A voltage of the power-on reset signal PORB is correlated to the voltage of the power input terminal N2. In some embodiments, power-on reset signal PORB is not a required signal, the actual implementation is not limited thereto.

Referring to FIG. 2, the signal generation circuit 25 is coupled to the power input terminal N2, the logic circuit 213 and the discharge circuit 215. The signal generation circuit 25 generates the corresponding power-on reset signal PORB according to an output status of the power input terminal N2.

In some embodiments, when the power input terminal N2 is powered off and the signal connection terminal N1 still receives an input signal, the switch circuit 211 and the logic circuit 213 control the base control signal P0G by using the supply power HV of the internal power supply terminal N3 generated by the backflow of the input signal, so that the voltage of the base control signal P0G is controlled to increase from the ground voltage to the first voltage value V1. The first voltage value V1 is between the ground voltage and the voltage of the input signal. After the voltage of the base control signal P0G reaches the first voltage value V1, the logic circuit 213 outputs the power control signal P1G. A voltage value of the power control signal P1G is a second voltage value V2. When the power input terminal N2 is powered off, the supply power HV is supplied by the internal power supply terminal N3, so the second voltage value V2 is identical to the voltage value of the internal power supply terminal N3. The source of the internal power supply terminal N3 comes from the backflow from the signal connection terminal N1. In the example shown in the figures of the disclosure, if the power input terminal N2 is powered off and the signal connection terminal N1 receives the input signal, this leads to backflow in the forward bias path of the parasitic diode from the sixth terminal S3 to the third base terminal B3. Therefore, the voltage of the internal power supply terminal N3 at this time should be 3.3 V−0.7 V=2.6 V (assuming that the voltage of the signal connection terminal N1 is 3.3 V), and accordingly, the number of the plurality of diodes 231 in FIG. 1 is two, so as to prevent the additional backflow in this path.

Referring to FIG. 1, in some embodiments, the switch circuit 211 further includes a third switch element PM1. The third switch element PM1 has a fifth terminal D3, a sixth terminal S3, a third control terminal G3 and a third base terminal B3. The sixth terminal S3 is coupled to the signal connection terminal N1. The fifth terminal D3 is coupled to the second control terminal G2 and the logic circuit 213. The fifth terminal D3 provides the base control signal P0G. The third control terminal G3 is coupled to the power input terminal N2. The third base terminal B3 is coupled to the third terminal D2. The third base terminal B3 is configured to receive the base voltage BODY.

Referring to FIG. 1 and FIG. 2, in some embodiments, the discharge circuit 215 is coupled between the switch circuit 211 and a ground wire HG. The discharge circuit 215 optionally electrically connects the switch circuit 211 to the ground wire HG according to the power-on reset signal PORB, such that the voltage value of the base control signal P0G is decreased to the ground voltage value.

In some embodiments, the discharge circuit 215 has a ground switch element PM3 and an impedance element R. The ground switch element PM3 has a seventh terminal D4, an eighth terminal S4 and a fourth control terminal G4. The seventh terminal D4 is electrically connected to the switch circuit 211. The seventh terminal D4 is configured to receive the base control signal P0G. The eighth terminal S4 is coupled to the ground wire HG. The fourth control terminal G4 is configured to receive the power-on reset signal PORB. The impedance element R is coupled between the seventh terminal D4 and the switch circuit 211. The seventh terminal D4 receives the base control signal P0G via the impedance element R.

Various implementations of the logic circuit will be introduced in conjunction with the accompanying drawings. Referring to FIG. 1, in some embodiments, the logic circuit 213 includes: a first inverter NOT1 and a first NAND gate NAND1. An input terminal of the first inverter NOT1 is coupled to the switch circuit 211. The input terminal of the first inverter NOT1 is configured to receive the base control signal P0G. An input terminal of the first NAND gate NAND1 is coupled to an output terminal of the first inverter NOT1. Another input terminal of the first NAND gate NAND1 is configured to receive the power-on reset signal PORB. An output terminal of the first NAND gate NAND1 is coupled to the first control terminal G1 of the first switch element PMP. The first NAND gate NAND1 is configured to output the power control signal P1G. The first inverter NOT1 and the first NAND gate NAND1 are respectively coupled to the ground wire HG. The internal power supply terminal N3 outputs the supply power HV to the first inverter NOT1 and the first NAND gate NAND1.

Figure 3:
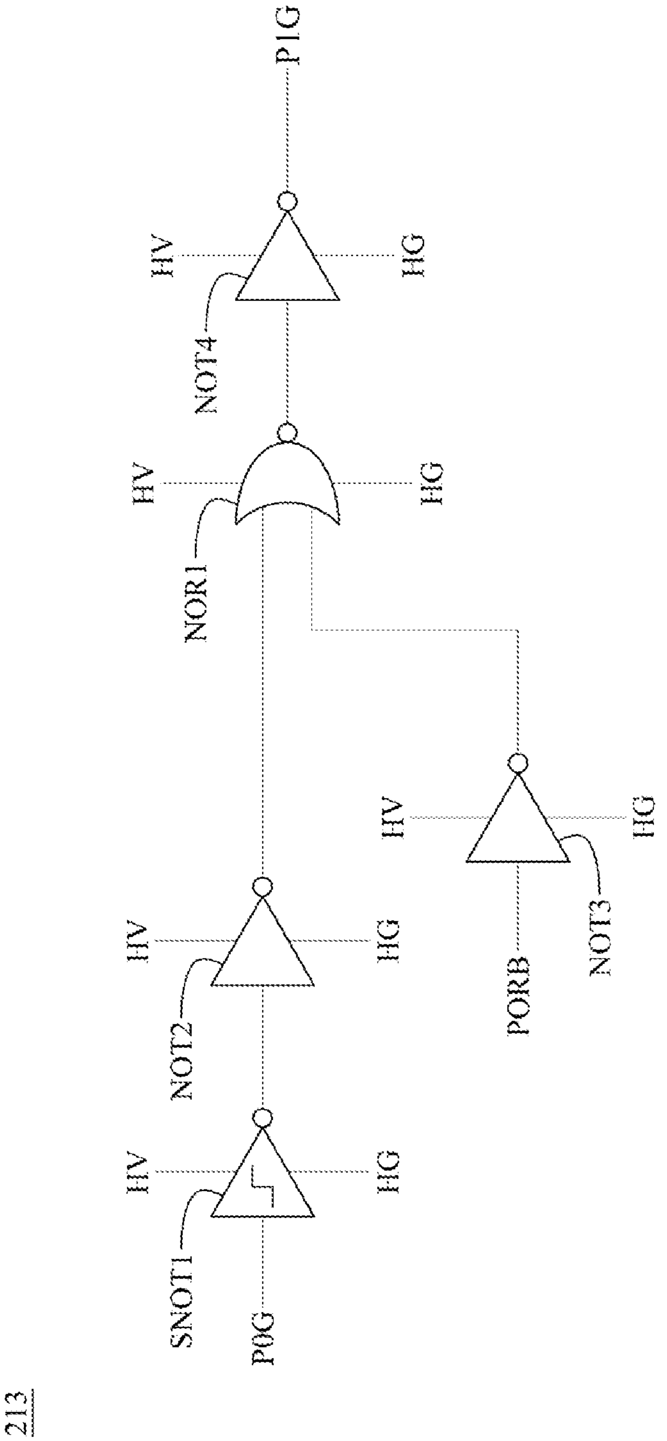
FIG. 3 shows a detailed circuit diagram of an example of a logic circuit in FIG. 2.

Referring to FIG. 3, in some embodiments, the logic circuit 213 includes: a first inverting Schmitt trigger SNOT1, a second inverter NOT2, a third inverter NOT3, a first NOR gate NOR1 and a fourth inverter NOT4. An input terminal of the first inverting Schmitt trigger SNOT1 is coupled to the switch circuit 211. The input terminal of the first inverting Schmitt trigger SNOT1 is configured to receive the base control signal P0G. An input terminal of the second inverter NOT2 is coupled to an output terminal of the first inverting Schmitt trigger SNOT1. An input terminal of the third inverter NOT3 is configured to receive the power-on reset signal PORB. An input terminal of the first NOR gate NOR1 is coupled to an output terminal of the second inverter NOT2. Another input terminal of the first NOR gate NOR1 is coupled to an output terminal of the third inverter NOT3. An input terminal of the fourth inverter NOT4 is coupled to an output terminal of the first NOR gate NOR1. An output terminal of the fourth inverter NOT4 is coupled to the first control terminal G1. The output terminal of the fourth inverter NOT4 is configured to output the power control signal P1G. The internal power supply terminal N3 outputs the supply power HV to the first inverting Schmitt trigger SNOT1, the second inverter NOT2, the third inverter NOT3, the first NOR gate NOR1 and the fourth inverter NOT4. The first inverting Schmitt trigger SNOT1, the second inverter NOT2, the third inverter NOT3, the first NOR gate NOR1 and the fourth inverter NOT4 are respectively coupled to the ground wire HG.

Figure 4:
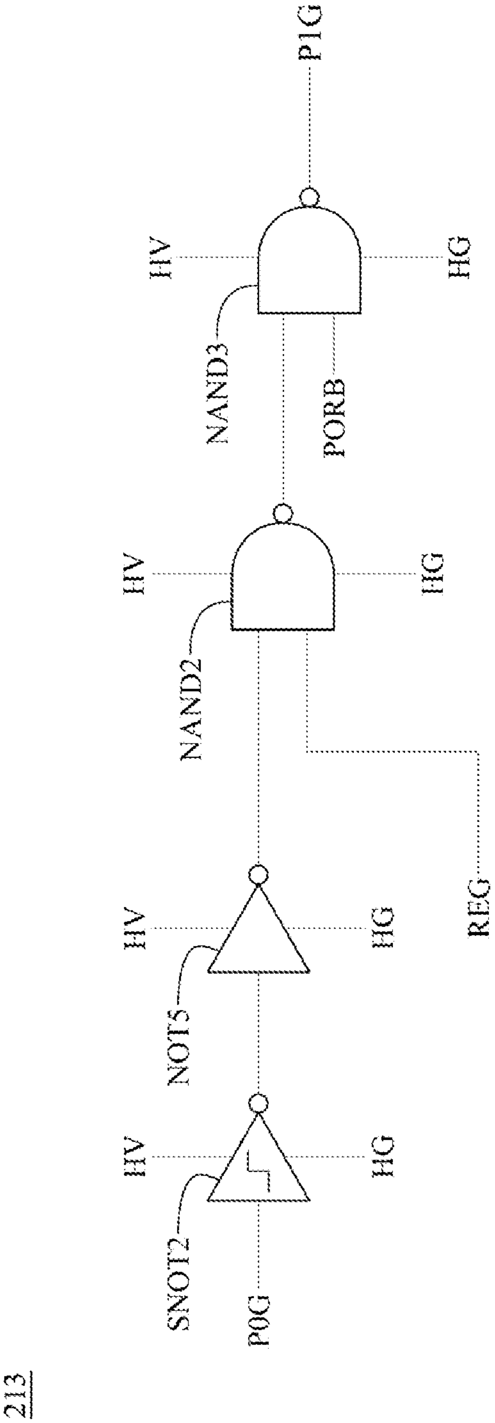
FIG. 4 shows a detailed circuit diagram of another example of a logic circuit in FIG. 2.

Referring to FIG. 4, in some embodiments, the logic circuit 213 includes: a second inverting Schmitt trigger SNOT2, a fifth inverter NOT5, a second NAND gate NAND2 and a third NAND gate NAND3. An input terminal of the second inverting Schmitt trigger SNOT2 is coupled to the switch circuit 211. The input terminal of the second inverting Schmitt trigger SNOT2 is configured to receive the base control signal P0G. An input terminal of the fifth inverter NOT5 is coupled to an output terminal of the second inverting Schmitt trigger SNOT2. An input terminal of the second NAND gate NAND2 is coupled to an output terminal of the fifth inverter NOT5. Another input terminal of the second NAND gate NAND2 is configured to receive an enable signal REG. The enable signal REG can be used to shield the base control signal P0G, that is, to turn off the function of preventing current backflow. The enable signal REG is provided by an external register. An input terminal of the third NAND gate NAND3 is coupled to an output terminal of the second NAND gate NAND2. Another input terminal of the third NAND gate NAND3 is configured to receive the power-on reset signal PORB. An output terminal of the third NAND gate NAND3 is coupled to the first control terminal G1. The output terminal of the third NAND gate NAND3 is configured to output the power control signal P1G. The internal power supply terminal N3 outputs the supply power HV to the second inverting Schmitt trigger SNOT2, the fifth inverter NOT5, the second NAND gate NAND2 and the third NAND gate NAND3. The second inverting Schmitt trigger SNOT2, the fifth inverter NOT5, the second NAND gate NAND2 and the third NAND gate NAND3 are respectively coupled to the ground wire HG.

Figure 5:
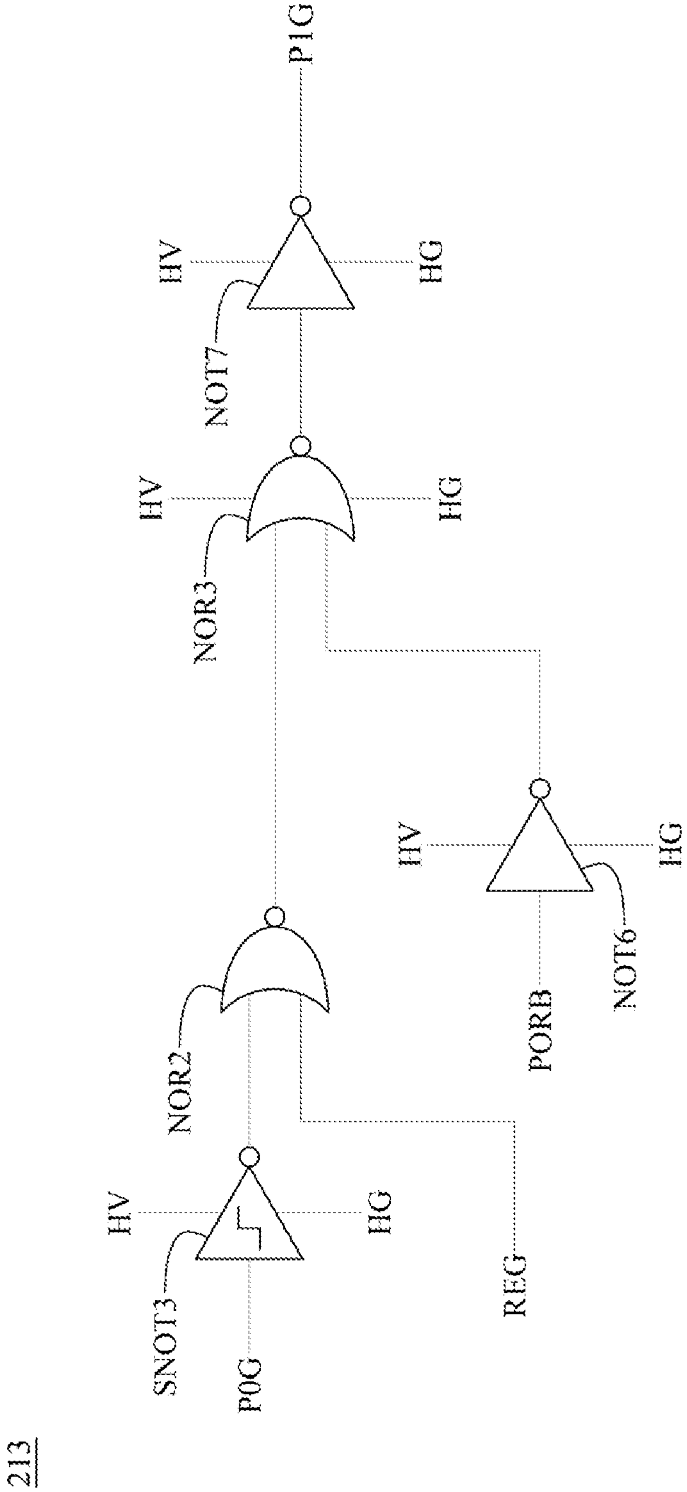
FIG. 5 shows a detailed circuit diagram of still another example of a logic circuit in FIG. 2.

Referring to FIG. 5, in some embodiments, the logic circuit 213 includes: a third inverting Schmitt trigger SNOT3, a second NOR gate NOR2, a sixth inverter NOT6, a third NOR gate NOR3 and a seventh inverter NOT7. An input terminal of the third inverting Schmitt trigger SNOT3 is coupled to the switch circuit 211. The input terminal of the third inverting Schmitt trigger SNOT3 is configured to receive the base control signal P0G. An input terminal of the second NOR gate NOR2 is coupled to an output terminal of the third inverting Schmitt trigger SNOT3. Another input terminal of the second NOR gate NOR2 is configured to receive an enable signal REG. An input terminal of the sixth inverter NOT6 is configured to receive the power-on reset signal PORB. An input terminal of the third NOR gate NOR3 is coupled to an output terminal of the second NOR gate NOR2. Another input terminal of the third NOR gate NOR3 is coupled to an output terminal of the sixth inverter NOT6. An input terminal of the seventh inverter NOT7 is coupled to an output terminal of the third NOR gate NOR3. An output terminal of the seventh inverter NOT7 is coupled to the first control terminal G1. The output terminal of the seventh inverter NOT7 is configured to output the power control signal P1G. The internal power supply terminal N3 outputs the supply power HV to the third inverting Schmitt trigger SNOT3, the second NOR gate NOR2, the sixth inverter NOT6, the third NOR gate NOR3 and the seventh inverter NOT7. The third inverting Schmitt trigger SNOT3, the second NOR gate NOR2, the sixth inverter NOT6, the third NOR gate NOR3 and the seventh inverter NOT7 are respectively coupled to the ground wire HG.

When the power pad HVP is in an off state, the power-on reset signal PORB is 0. The voltage of the power control signal P1G comes from the supply power HV of the internal power supply terminal N3. At this time, the first switch element PMP is in an off state. Therefore, the leakage current cannot flow to the first terminal D1 and the power pad HVP.

Referring to FIG. 6, when the power input terminal N2 is powered off and the signal connection terminal N1 still receives the input signal (or a leakage current), the voltage value of the power-on reset signal PORB is zero. The voltage value of the internal power supply terminal N3 decreases continuously. The second switch element PM0 is off. The voltage value of the fifth terminal D3 is higher than that of the third control terminal G3, so that the third switch element PM1 is turned on. The voltage value of the base control signal P0G increases. The ground switch element PM3 is turned off. The voltage value of the power control signal P1G increases to be the same as the voltage value of the internal power supply terminal N3. Therefore, the first switch element PMP is turned off, so that the input signal or leakage current from the signal connection terminal N1 cannot flow into the power input terminal N2, thereby preventing the current backflow to the power input terminal N2.

Referring to FIG. 7, when the power input terminal N2 receives a power, the power-on reset signal PORB has a voltage value. At this time, the voltage value of the fifth terminal D3 is lower than that of the third control terminal G3, so that the third switch element PM1 and the fourth switch element PM2 are turned off. The ground switch element PM3 is turned on. The voltage value of the base control signal P0G is 0. The voltage value of the power control signal P1G is 0. The second switch element PM0 is turned on. The first switch element PMP is turned on. The voltage value of the internal power supply terminal N3 is the same as that of the power input terminal N2. The voltage of the signal connection terminal N1, which belongs to an independent voltage source, the voltage value of the signal connection terminal is correlated to the power pad HVP1 of the first chip 30.

When the power input terminal N2 is powered off, the cut-off control circuit 21 detects whether there is an input signal or leakage current inputted into the power input terminal N2. Once an input signal or leakage current is detected, the cut-off control circuit 21 pulls up the voltage value of the power control signal P1G such that the first switch element PMP is turned off, thereby preventing the input signal or leakage current from being inputted into the power input terminal N2.

In some embodiments, the first switch element PMP, the second switch element PM0, the third switch element PM1, the fourth switch element PM2 and the ground switch element PM3 may be PMOSs (P-type field-effect transistor).

Based on the above, according to the circuit for preventing current backflow, the chip and the electronic system of any embodiment, when power stops being inputted into the power input terminal N2 (i.e., when the power input terminal is powered off), but a leakage current or an input signal still is inputted into the signal connection terminal N1, the cut-off control circuit 21 controls the first switch element PMP to be turned off so as to break electrical connection between the power pad HVP (which may also be regarded as the power input terminal N2) and the internal power supply terminal N3, thereby preventing the current from flowing into the power input terminal N2 from the internal power supply terminal N3, making the power input terminal N2, which should be in a power-off state, become charged. This can prevent the current backflow, and also prevent the leakage current from flowing into the power pad HVP via the signal pad SP and the fifth switch element PM4. In addition, it is worth mentioning that the fifth switch element PM4 generally has a drain electrode coupled to the signal connection terminal N1, a source electrode and a gate electrode coupled to any points, and a base electrode coupled to the internal power supply terminal N3 or a base electrode of other switch element.

Although the disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A circuit for preventing current backflow, comprising:
- a signal connection terminal;
- a power input terminal;
- an internal power supply terminal;
- an electrostatic protection circuit, coupled to the signal connection terminal and the internal power supply terminal;
- a first switch element, coupled between the power input terminal and the internal power supply terminal;
- a cut-off control circuit, coupled to the signal connection terminal, the power input terminal and the first switch element so as to control switching of the first switch element according to a voltage of the signal connection terminal and a voltage of the power input terminal; and
- a second switch element, coupled to the internal power supply terminal so as to provide a base voltage according to the voltage of the internal power supply terminal;
- wherein the cut-off control circuit is further coupled to the second switch element so as to control switching of the second switch element according to the voltage of the signal connection terminal and the voltage of the power input terminal.

2. The circuit for preventing current backflow according to claim 1, wherein when the power input terminal is powered off, the signal connection terminal still receives an input signal and a voltage of the internal power supply terminal is greater than the voltage of the power input terminal, the cut-off control circuit generates a power control signal to turn off the first switch element.

3. The circuit for preventing current backflow according to claim 1, wherein when the power input terminal is powered off and the signal connection terminal still receives an input signal, the cut-off control circuit increases a voltage of a base control signal from a ground voltage to a first voltage by using the input signal so as to turn off the second switch element.

4. The circuit for preventing current backflow according to claim 1, wherein the cut-off control circuit comprises:
- a switch circuit, coupled to the signal connection terminal, the power input terminal and the second switch element so as to generate a base control signal according to the voltage of the signal connection terminal and the voltage of the power input terminal, the second switch element being controlled by the base control signal; and
- a logic circuit, coupled between the switch circuit and the first switch element, and powered by the internal power supply terminal so as to receive the base control signal and a power-on reset signal and generate a power control signal according to the base control signal and the power-on reset signal, the first switch element being controlled by the power control signal, and the power-on reset signal being correlated to the voltage of the power input terminal.

5. The circuit for preventing current backflow according to claim 4, wherein when the power input terminal is powered off and the signal connection terminal still receives an input signal, the switch circuit and the logic circuit increase a voltage of the base control signal from a ground voltage to a first voltage between the ground voltage and a voltage of the input signal by using the voltage of the input signal so as to turn off the second switch element; and after the voltage of the base control signal reaches the first voltage, the logic circuit increases the voltage of the power control signal from the ground voltage to a second voltage identical to the voltage of the internal power supply terminal so as to turn off the first switch element.

6. The circuit for preventing current backflow according to claim 4, wherein the switch circuit comprises:
- a third switch element, having:
- a sixth terminal, coupled to the signal connection terminal;
- a fifth terminal, coupled to a second control terminal of the second switch element and the logic circuit and configured to provide the base control signal;
- a third control terminal, coupled to the power input terminal; and
- a third base terminal, coupled to a third terminal of the second switch element and configured to receive the base voltage.

7. The circuit for preventing current backflow according to claim 4, wherein the cut-off control circuit further comprises:
- a discharge circuit, coupled between the switch circuit and a ground wire so as to optionally electrically connect the switch circuit to the ground wire according to the power-on reset signal such that the voltage of the base control signal is pulled down to a ground voltage.

8. The circuit for preventing current backflow according to claim 7, wherein the discharge circuit comprises:
- a ground switch element, having:
- an input terminal, electrically connected to the switch circuit and configured to receive the base control signal;
- an output terminal, coupled to the ground wire; and
- a control terminal, configured to receive the power-on reset signal.

9. The circuit for preventing current backflow according to claim 8, wherein the discharge circuit further comprises:
- an impedance element, coupled between the input terminal of the ground switch element and the switch circuit, the input terminal of the ground switch element receiving the base control signal via the impedance element.

10. The circuit for preventing current backflow according to claim 4, wherein the logic circuit comprises:
- a first inverter, an input terminal of the first inverter being coupled to the switch circuit and configured to receive the base control signal; and
- a first NAND gate, an input terminal of the first NAND gate being coupled to an output terminal of the first inverter, another input terminal of the first NAND gate being configured to receive the power-on reset signal, and an output terminal of the first NAND gate being coupled to a first control terminal of the first switch element and configured to output the power control signal;

wherein the first inverter and the first NAND gate are powered by the internal power supply terminal.

11. The circuit for preventing current backflow according to claim 4, wherein the logic circuit comprises:

a first inverting Schmitt trigger, an input terminal of the first inverting Schmitt trigger being coupled to the switch circuit and configured to receive the base control signal;

a second inverter, an input terminal of the second inverter being coupled to an output terminal of the first inverting Schmitt trigger;

a third inverter, an input terminal of the third inverter being configured to receive the power-on reset signal;

a first NOR gate, an input terminal of the first NOR gate being coupled to an output terminal of the second inverter, and another input terminal of the first NOR gate being coupled to an output terminal of the third inverter; and a fourth inverter, an input terminal of the fourth inverter being coupled to an output terminal of the first NOR gate, and an output terminal of the fourth inverter being coupled to a first control terminal of the first switch element and configured to output the power control signal;

wherein the first inverting Schmitt trigger, the second inverter, the third inverter, the first NOR gate and the fourth inverter are powered by the internal power supply terminal.

12. The circuit for preventing current backflow according to claim 4, wherein the logic circuit comprises:

a second inverting Schmitt trigger, an input terminal of the second inverting Schmitt trigger being coupled to the switch circuit and configured to receive the base control signal;

a fifth inverter, an input terminal of the fifth inverter being coupled to an output terminal of the second inverting Schmitt trigger;

a second NAND gate, an input terminal of the second NAND gate being coupled to an output terminal of the fifth inverter, and another input terminal of the second NAND gate being configured to receive an enable signal; and a third NAND gate, an input terminal of the third NAND gate being coupled to an output terminal of the second NAND gate, another input terminal of the third NAND gate being configured to receive the power-on reset signal, and an output terminal of the third NAND gate being coupled to a first control terminal of the first switch element and configured to output the power control signal;

wherein the second inverting Schmitt trigger, the fifth inverter, the second NAND gate and the third NAND gate are powered by the internal power supply terminal.

13. The circuit for preventing current backflow according to claim 4, wherein the logic circuit comprises:

a third inverting Schmitt trigger, an input terminal of the third inverting Schmitt trigger being coupled to the switch circuit and configured to receive the base control signal;

a second NOR gate, an input terminal of the second NOR gate being coupled to an output terminal of the third inverting Schmitt trigger, and another input terminal of the second NOR gate being configured to receive an enable signal;

a sixth inverter, an input terminal of the sixth inverter being configured to receive the power-on reset signal;

a third NOR gate, an input terminal of the third NOR gate being coupled to an output terminal of the second NOR gate, and another input terminal of the third NOR gate being coupled to an output terminal of the sixth inverter; and a seventh inverter, an input terminal of the seventh inverter being coupled to an output terminal of the third NOR gate, and an output terminal of the seventh inverter being coupled to a first control terminal of the first switch element and configured to output the power control signal;

wherein the third inverting Schmitt trigger, the second NOR gate, the sixth inverter, the third NAND gate and seventh inverter are powered by the internal power supply terminal.

14. The circuit for preventing current backflow according to claim 4, further comprising:

a signal generation circuit, coupled to the power input terminal and the logic circuit so as to generate the corresponding power-on reset signal according to an output status of the power input terminal.

15. The circuit for preventing current backflow according to claim 1, wherein the electrostatic protection circuit comprises:

a plurality of diodes, the plurality of diodes being connected in series between the internal power supply terminal and the signal connection terminal.

16. A chip, comprising:

a signal pad;

a power pad;

a ground pad;

an internal power supply terminal;

an electrostatic protection circuit, coupled to the internal power supply terminal, the signal pad and the ground pad;

a first switch element, coupled between the power pad and the internal power supply terminal;

a cut-off control circuit, coupled to the signal pad, the power pad and the first switch element so as to control switching of the first switch element according to a voltage of the signal pad and a voltage of the power pad;

a chip main circuit, coupled to the signal pad, the power pad and the ground pad; and a second switch element, coupled to the internal power supply terminal so as to provide a base voltage according to the voltage of the internal power supply terminal;

wherein the cut-off control circuit is further coupled to the second switch element so as to control switching of the second switch element according to the voltage of the signal pad and the voltage of the power pad.

17. An electronic system, comprising:

a first chip; and a second chip, coupled to the first chip, the second chip comprising:

a signal pad, coupled to the first chip and configured to receive an input signal from the first chip;

a power pad;

a ground pad;

an internal power supply terminal;

an electrostatic protection circuit, coupled to the internal power supply terminal, the signal pad and the ground pad;

a first switch element, coupled between the power pad and the internal power supply terminal so as to turn on or off electrical connection between the power pad and the internal power supply terminal;

a cut-off control circuit, coupled to the signal pad, the power pad and the first switch element so as to control switching of the first switch element according to a voltage of the signal pad and a voltage of the power pad;

a chip main circuit, coupled to the signal pad, the power pad and the ground pad; and a second switch element, coupled to the internal power supply terminal so as to provide a base voltage according to the voltage of the internal power supply terminal;

wherein the cut-off control circuit is further coupled to the second switch element so as to control switching of the second switch element according to the voltage of the signal pad and the voltage of the power pad.

* * * * *